United States Patent
Chen

(10) Patent No.: US 10,263,417 B2
(45) Date of Patent: Apr. 16, 2019

(54) TRANSIENT VOLTAGE SUPPRESSING INTEGRATED CIRCUIT

(71) Applicant: uPI Semiconductor Corp., Hsinchu County (TW)

(72) Inventor: Chih-Hao Chen, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 290 days.

(21) Appl. No.: 15/183,766

(22) Filed: Jun. 15, 2016

(65) Prior Publication Data

US 2017/0294775 A1    Oct. 12, 2017

(30) Foreign Application Priority Data

Apr. 11, 2016 (TW) .............................. 105111171 A

(51) Int. Cl.

| H02H 9/04 | (2006.01) |
|---|---|
| H02H 9/00 | (2006.01) |
| H01L 27/02 | (2006.01) |
| H01L 25/065 | (2006.01) |
| H02H 3/33 | (2006.01) |
| B60L 3/04 | (2006.01) |
| H02H 1/04 | (2006.01) |
| H02H 1/00 | (2006.01) |

(52) U.S. Cl.
CPC .............. *H02H 9/04* (2013.01); *H01L 25/065* (2013.01); *H01L 27/0248* (2013.01); *H01L 27/0255* (2013.01); *H02H 9/005* (2013.01); *B60L 3/04* (2013.01); *H02H 1/0015* (2013.01); *H02H 1/043* (2013.01); *H02H 3/33* (2013.01); *H02H 9/046* (2013.01)

(58) Field of Classification Search
USPC ......................................... 361/56, 91.1, 111
See application file for complete search history.

(56) References Cited

U.S. PATENT DOCUMENTS

| 8,835,976 | B2 | 9/2014 | Kashyap et al. | |
|---|---|---|---|---|
| 2006/0132996 | A1* | 6/2006 | Poulton | H01L 27/0255 361/56 |
| 2010/0006889 | A1* | 1/2010 | Marreiro | H01L 27/0255 257/106 |
| 2011/0163352 | A1* | 7/2011 | Gee | H01L 23/60 257/173 |
| 2012/0033335 | A1* | 2/2012 | Wang | H01L 23/60 361/56 |
| 2013/0063843 | A1* | 3/2013 | Chen | H01L 23/552 361/56 |
| 2014/0071566 | A1* | 3/2014 | Parthasarathy | H01L 23/62 361/56 |

* cited by examiner

Primary Examiner — Danny Nguyen
(74) Attorney, Agent, or Firm — JCIPRNET

(57) ABSTRACT

A transient voltage suppressing (TVS) integrated circuit includes an input output pin, a ground pin, a substrate, a first TVS die and a second TVS die. The substrate provides a common bus. The first TVS die is disposed on the substrate, and includes a first input output terminal and a first reference ground terminal. The second TVS die is disposed on the substrate and includes a second input output terminal and a second reference ground terminal. The second reference ground terminal is electrically coupled to the first reference ground terminal through the common bus, and the first input output terminal is coupled to the first input out pin, and the second input output terminal is coupled to a ground pin.

10 Claims, 8 Drawing Sheets

TRANSIENT VOLTAGE SUPPRESSING INTEGRATED CIRCUIT

CROSS-REFERENCE TO RELATED APPLICATION

This application claims the priority benefit of Taiwan application serial no. 105111171, filed on Apr. 11, 2016. The entirety of the above-mentioned patent application is hereby incorporated by reference herein and made a part of this specification.

BACKGROUND OF THE INVENTION

1. Field of the Invention

The invention relates to a transient voltage suppressing integrated circuit, and particularly relates to a transient voltage suppressing integrated circuit capable of dispersing an energy of electrostatic discharge.

2. Description of Related Art

In the conventional technology of integrated circuit, it is common to use a transient voltage suppressor (TVS) to provide a path for an electrostatic discharge current, so as to protect the integrated circuit from being damaged due to electrostatic discharge. In the conventional technology, the transient voltage suppressor provides a diode string connected in series between a power terminal and a ground terminal to work with a Zener diode, so as to generate a current path accordingly to provide protection against electrostatic discharge. However, when an electrostatic discharge voltage is presented on an input/output terminal of the transient voltage suppressor, all the energy of the electrostatic discharge is undertaken by the single transient voltage suppressor. Thus, the protective capability that the transient voltage suppressor is able to offer against the electrostatic discharge is limited.

SUMMARY OF THE INVENTION

The invention provides a transient voltage suppressing integrated circuit capable of facilitating a protective capability against electrostatic discharge.

A transient voltage suppressing integrated circuit according to an embodiment of the invention includes an input output pin, a ground pin, a substrate, a first transient voltage suppressing die, and a second transient voltage suppressing die. The substrate provides a common bus. The first transient voltage suppressing die is disposed on the substrate and includes a first input output terminal and a first reference ground terminal. The second transient voltage suppressing die is disposed on the substrate and includes a second input output terminal and a second reference ground terminal. The second reference ground terminal is electrically coupled to the first reference ground terminal through the common bus, the first input output terminal is coupled to the input output pin, and the second input output terminal is coupled to the ground pin.

According to an embodiment of the invention, the first transient voltage suppressing die includes a diode string and a Zener diode and is coupled between a power terminal and the first reference ground terminal. The diode string includes the first input output terminal. An anode of the Zener diode is coupled to the first reference ground terminal, and a cathode of the Zener diode is coupled to the power terminal.

According to an embodiment of the invention, the diode string includes a first channel diode and a second channel diode. A cathode of the first channel diode is coupled to the power terminal, and an anode of the first channel diode is coupled to the first input output terminal. A cathode of the second channel diode is coupled to the anode of the first channel diode, and an anode of the second channel diode is coupled to the first reference ground terminal.

According to an embodiment of the invention, the second transient voltage suppressing die includes a diode string and a Zener diode. The diode string is coupled between a power terminal and the second reference ground terminal and includes the second input output terminal. An anode of the Zener diode is coupled to the second reference ground terminal, and a cathode of the Zener diode is coupled to the power terminal.

According to an embodiment of the invention, the diode string includes a first channel diode and a second channel diode. A cathode of the first channel diode is coupled to the power terminal, and an anode of the first channel diode is coupled to the second input output terminal. A cathode of the second channel diode is coupled to the anode of the first channel diode, and the anode of the second channel diode is coupled to the second reference ground terminal.

According to an embodiment of the invention, the second transient voltage suppressing die and the first transient voltage suppressing die have the same structures.

According to an embodiment of the invention, bases of the transient voltage suppressing dies are electrically isolated from the substrate.

According to an embodiment of the invention, the second transient voltage suppressing die further has a power terminal, and the power terminal is electrically coupled to the common bus.

According to an embodiment of the invention, when the number of the first transient voltage suppressing die is plural, the second transient voltage suppressing die is disposed at a geometric center of the transient voltage suppressing dies.

A transient voltage suppressing integrated circuit according to an embodiment of the invention includes at least one input output pin, a ground pin, a substrate, at least one first transient voltage suppressing die, and a second transient voltage suppressing die. The substrate provides a common bus. The first transient voltage suppressing die is disposed on the substrate and includes a first input output terminal and a first reference round terminal. The second transient voltage suppressing die is disposed on the substrate and includes a second input output terminal and a second reference ground terminal. The second reference ground terminal is electrically coupled to the first reference ground terminal through the common bus, the first input output terminal is coupled to one of the input output pin, and the second input output terminal is coupled to the ground pin. when an electrostatic discharge voltage is presented on one of the at least one input output pin, a current path passing through the first input output terminal coupled to the input output pin, the first reference ground terminal, the common bus, the second reference ground terminal, and the second input output terminal to the ground pin is formed.

Based on above, the transient voltage suppressing integrated circuit according to the embodiments is able to discharge an electrostatic discharge current by using the current path provided by the first transient voltage suppressing die and the second electrostatic voltage suppressing die when electrostatic discharge occurs. Thus, the energy of electrostatic discharge may be shared by the dies, so as to facilitate the protective capability of the transient voltage suppressing integrated circuit against electrostatic discharge.

The substrate in the embodiments of the invention may be a semiconductor substrate, a ceramic substrate, a printed circuit board, a lead frame, or any other conventional substrate, and the bus is disposed on the substrate. Moreover, in the embodiments of the invention, the substrate may serve as the common bus (e.g., lead frame), such that the transient voltage suppressing integrated circuit may have a preferable heat dissipation effect.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
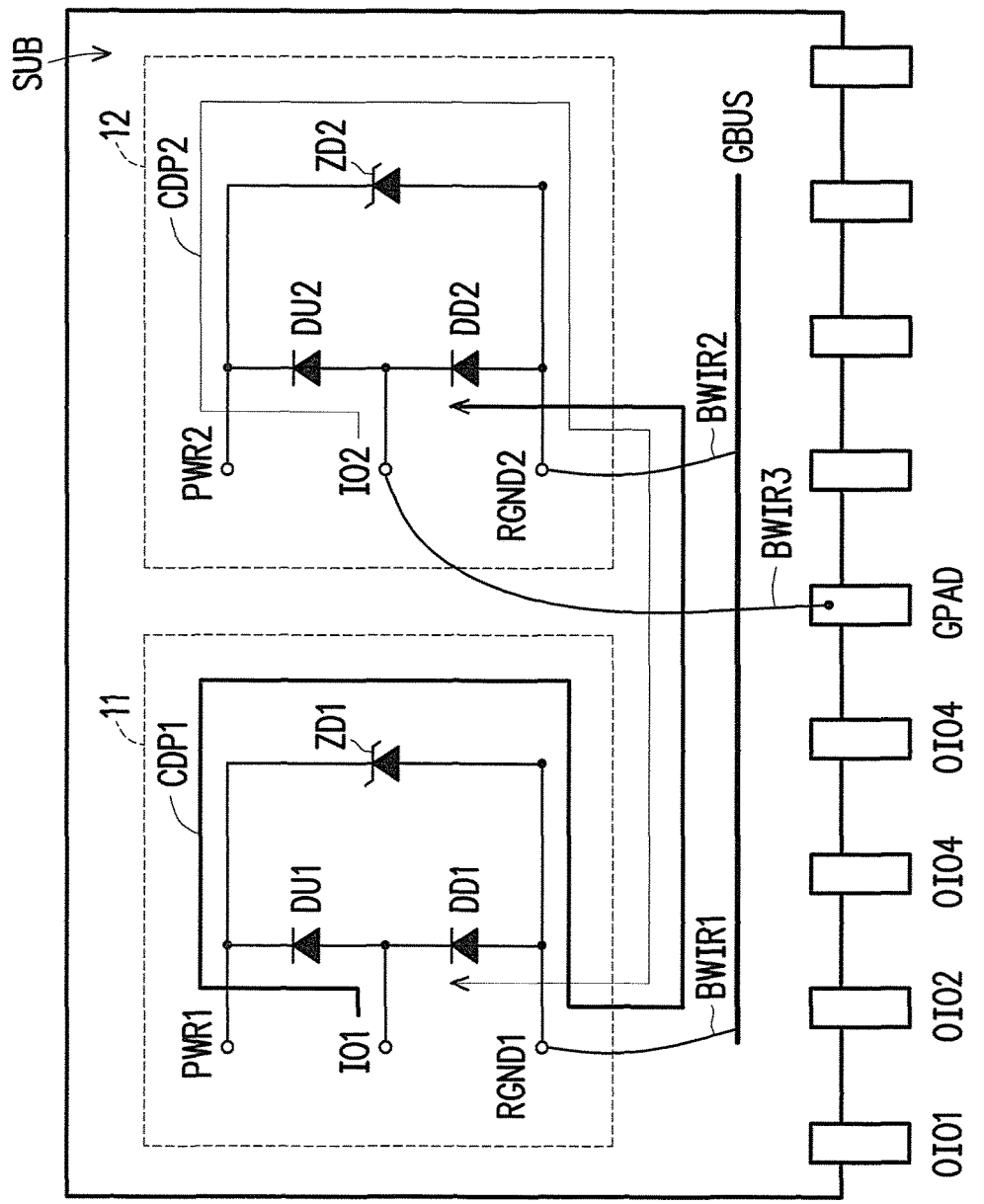
FIG. 1 is a schematic view illustrating an equivalent circuit and an electrostatic discharge operation of a transient suppressing integrated circuit of the invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, FIG. 1 is a schematic view illustrating an equivalent circuit and an electrostatic discharge operation of a transient suppressing integrated circuit of the invention. A transient voltage suppressing integrated circuit 100 includes a substrate SUB, input output pins OIO1 to OIO4, a ground pin GPAD, and transient voltage suppressing dies 11 and 12. The substrate SUB provides a common bus GBUS, the transient voltage suppressing dies 11 and 12 are disposed on the substrate SUB, the first transient voltage suppressing die 11 includes a diode string formed by channel diodes DU1 and DD1 connected in series, and the second transient voltage suppressing die 12 includes a diode string formed by channel diodes DU2 and DD2 connected in series. In this embodiment, a cathode of the channel diode DU1 is coupled to a power terminal PWR1, and an anode of the channel diode DU1 is coupled to a cathode of the channel diode DD1 and forms an input output terminal IO1. An anode of the channel diode DD1 is coupled to a reference ground terminal RGND1. In addition, a cathode of the channel diode DU2 is coupled to a power terminal PWR2, and the anode of the channel diode DU1 is coupled to a cathode of the channel diode DD2 and forms an input output terminal IO2. An anode of the channel diode DD2 is coupled to a reference ground terminal RGND2.

The transient voltage suppressing dies 11 and 12 respectively include Zener diodes ZD1 and ZD2. A cathode of the Zener diode ZD1 is coupled to the power terminal PWR1, and an anode of the Zener diode ZD1 is coupled to the reference ground terminal RGND1. A cathode of the Zener diode ZD2 is coupled to the power terminal PWR2, and an anode of the Zener diode ZD2 is coupled to the reference ground terminal RGND2.

In addition, the input output terminal IO1 may be electrically coupled to one of the input output pins OIO1 to OIO4 through a bonding wire.

The reference ground terminal RGND1 of the first transient voltage suppressing die 11 is electrically coupled to the common bus GBUS through a bonding wire BWIR1. In addition, the common bus GBUS may be a conductive substrate SUB (e.g., a lead frame) or a wire (or conductive layer) disposed on the substrate SUB. When the common bus GBUS is the conductive substrate SUB, the reference ground terminal RGND1 is directly electrically coupled to the substrate SUB through the bonding wire BWIR1. The reference ground terminal RGND2 of the second transient voltage suppressing die 12 is also electrically coupled to the common bus GBUS1 through a bonding wire BWIR2, and electrically coupled to the reference ground terminal RGND1. The input output terminal IO2 of the second transient voltage suppressing die 12 is electrically coupled to the ground pin GPAD of the transient voltage suppressing integrated circuit 100 through a bonding wire BWIR3, and may be coupled to a ground voltage through the ground pin GPAD.

When an electrostatic discharge occurs, and the input out terminal IO1 has a positive (i.e., greater than 0 V) electrostatic discharge voltage, for example, the channel diode DU1, the Zener diode ZD1, and the channel diode DD2 are conductive in correspondence with the electrostatic discharge voltage. A current path CDP1 is correspondingly formed, and an electrostatic discharge current may sequentially flow from the input output terminal IO1 and pass through the channel diode DU1, the Zener diode ZD1, the common bus GBUS, the channel diode DD2, and the input output terminal IO2 sequentially, so as to be discharged to the ground pin GPAD.

Alternatively, when an electrostatic discharge occurs, and a negative (lower than 0 V) electrostatic discharge voltage is presented on the input output terminal IO1, the channel diode DU2, the Zener diode ZD2, and the channel diode DD1 are conductive in correspondence with the electrostatic discharge voltage. A current path CDP2 is correspondingly formed, and an electrostatic discharge current may flow from the input output terminal IO2 and pass through the channel diode DU2, the Zener diode ZD2, the common bus GBUS, and the channel diode DD1 sequentially, so as to be discharged to the input output terminal IO1.

Accordingly, when an electrostatic discharge occurs, the transient voltage suppressing integrated circuit 100 of the embodiment use the transient voltage suppressing dies 11 and 12 to share the energy of electrostatic discharge. In other words, the common bus GBUS is used in the embodiment of the invention to allow a plurality of transient voltage suppressing dies to undertake the energy of electrostatic discharge, so as to facilitate a protective capability against electrostatic discharge.

In the embodiment, the transient voltage suppressing dies 11 and 12 may be dies having completely the same circuit structures. In this way, the embodiment of the invention is able to create different channels in one general transient voltage suppressing device by ways of packaging. Thus the energy of the electrostatic discharge may be undertaken by multiple dies without the needs of manufacturing an additional new photomask or a new wafer.

It should be noted that, in the embodiment of the invention, the common bus GBUS may be provided by directly using a conductive substrate SUB (e.g., lead frame). Thus, the transient voltage suppressing integrated circuit 100 may also exhibit a preferable heat dissipation effect when discharging the electrostatic discharge.

Figure 2A:
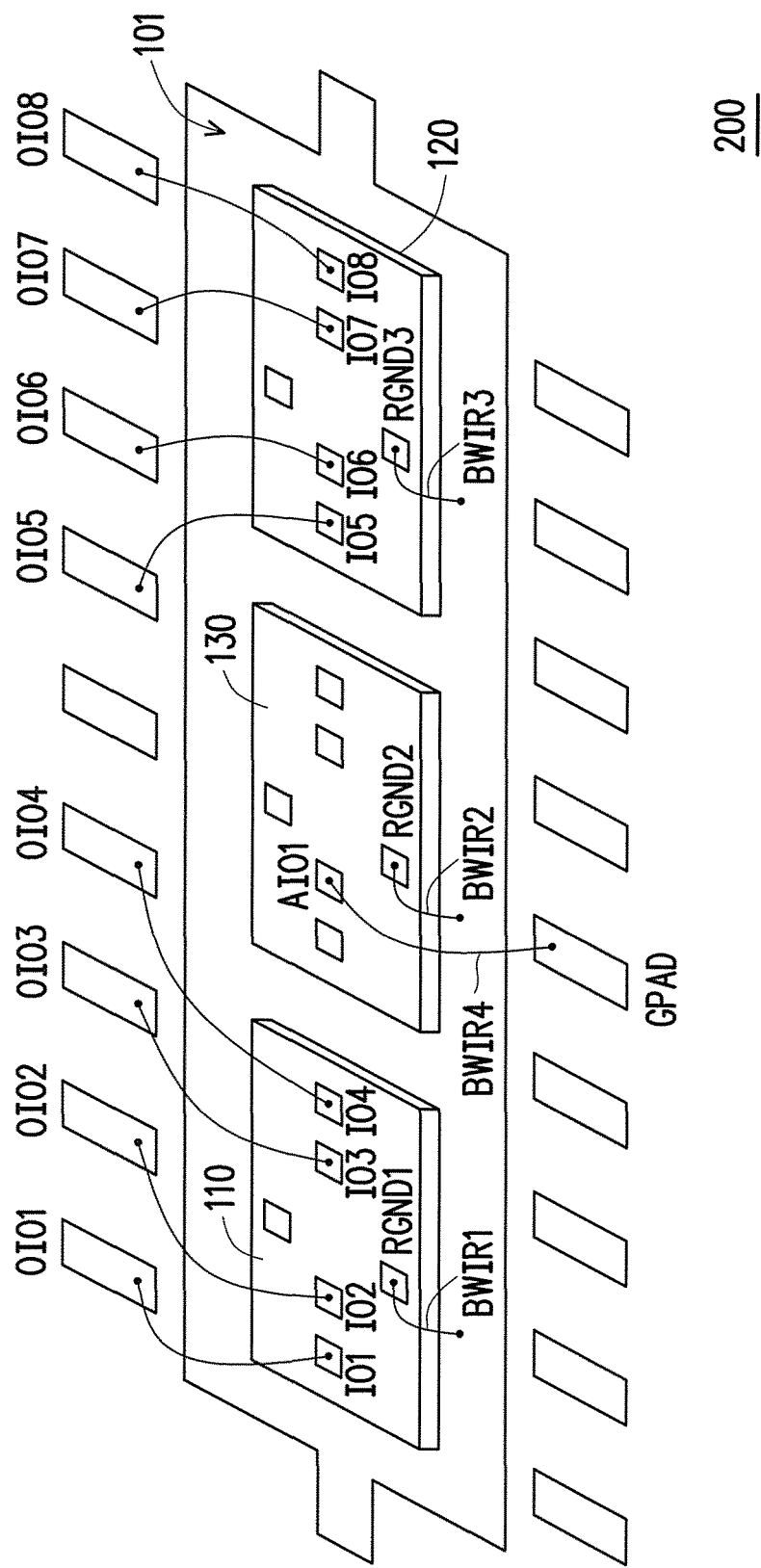
FIG. 2A is a schematic view illustrating a multi-channel transient voltage suppressing integrated circuit according to an embodiment of the invention.

Referring to FIG. 2A, FIG. 2A is a schematic view illustrating a multi-channel transient voltage suppressing integrated circuit according to an embodiment of the invention. What differs from the embodiment of FIG. 1 is that, the transient voltage suppressing die in the embodiment of FIG. 2A is a multi-channel transient voltage suppressing die and has an additional first transient voltage suppressing die 120 to provide more input output terminals.

A multi-channel transient voltage suppressing integrated circuit 200 includes a substrate 101 and transient voltage suppressing dies 110, 120, and 130. The transient voltage suppressing dies 110, 120, and 130 are respectively disposed at different positions of the substrate 101. In addition, a dielectric layer (not shown) may be provided at a contact surface between the transient voltage suppressing dies 110, 120, and 130 and the substrate 101, such that bases of the transient voltage suppressing dies 110, 120, and 130 are electrically isolated from the substrate 101.

The first transient suppressing dies 110 and 120 respectively have a plurality of input output terminals IO1 to IO4 and IO5 to IO8 and reference ground terminals RGND1 and RGND3. In this embodiment, the reference ground terminals RGND1 and RGND3 may be respectively electrically coupled to the substrate 101 by the bonding wires BWIR1 and BWIR3, and the substrate 101 may provide a bus so that the reference ground terminals RGND1 and RGND3 are coupled to each other.

Moreover, the input output terminals IO1 to IO8 may be respectively electrically coupled to a plurality of input output pins OIO1 to OIO9 of the multi-channel transient voltage suppressing integrated circuit 200 through a plurality of bonding wires.

The second transient voltage suppressing die 130 has one (or more) input output terminal AIO1 and the reference ground terminal RGND2. The reference ground terminal RGND2 of the second transient voltage suppressing die 130 may be electrically coupled to the reference ground terminal RGND1 through the substrate 101. In this embodiment, the reference ground terminal RGND2 of the second transient voltage suppressing die 130 may be electrically coupled to the bus provided by the substrate 101 through the bonding wire BWIR2, and electrically coupled to the reference round terminals RGND1 and RGND3 through the bus. Furthermore, the input output terminal AIO1 of the second transient voltage suppressing die 130 may be connected to the ground pin GPAD through a bonding wire BWIR4 and receive a ground voltage through the ground pin GPAD.

When an electrostatic discharge occurs, the electrostatic discharge current may enter the first transient voltage suppressing die 110 (or 120) from the input output pins OIO1 to OIO8. Through the bus provided by the substrate 101, the electrostatic discharge current may be further discharged to the ground pin GPAD (ground voltage) through the second transient voltage suppressing die 130, so as to provide protection against electrostatic discharge.

Figure 2B:
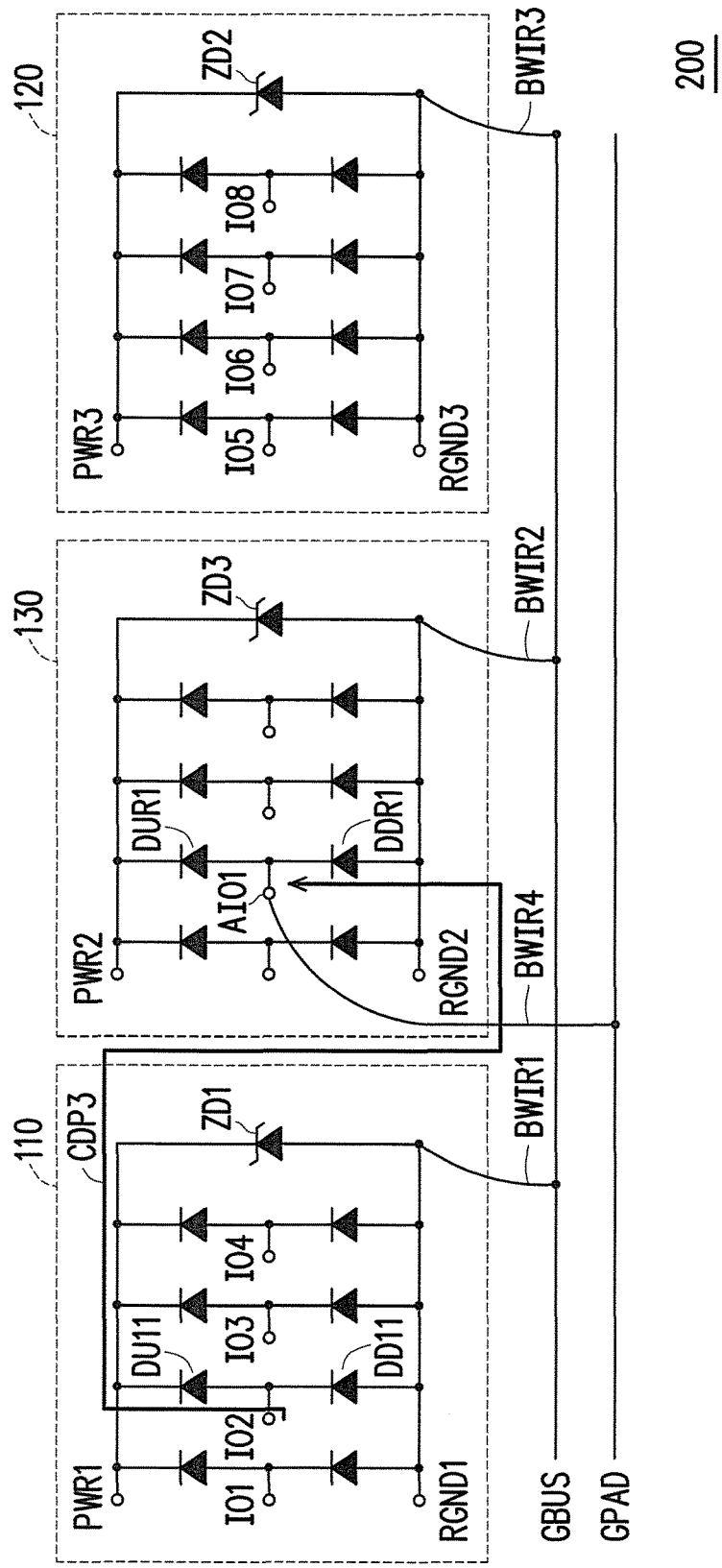
FIGS. 2B and 2C are schematic views illustrating an equivalent circuit and an electrostatic discharge operation of a multi-channel transient voltage suppressing integrated circuit according to an embodiment of the invention.
Figure 2C:
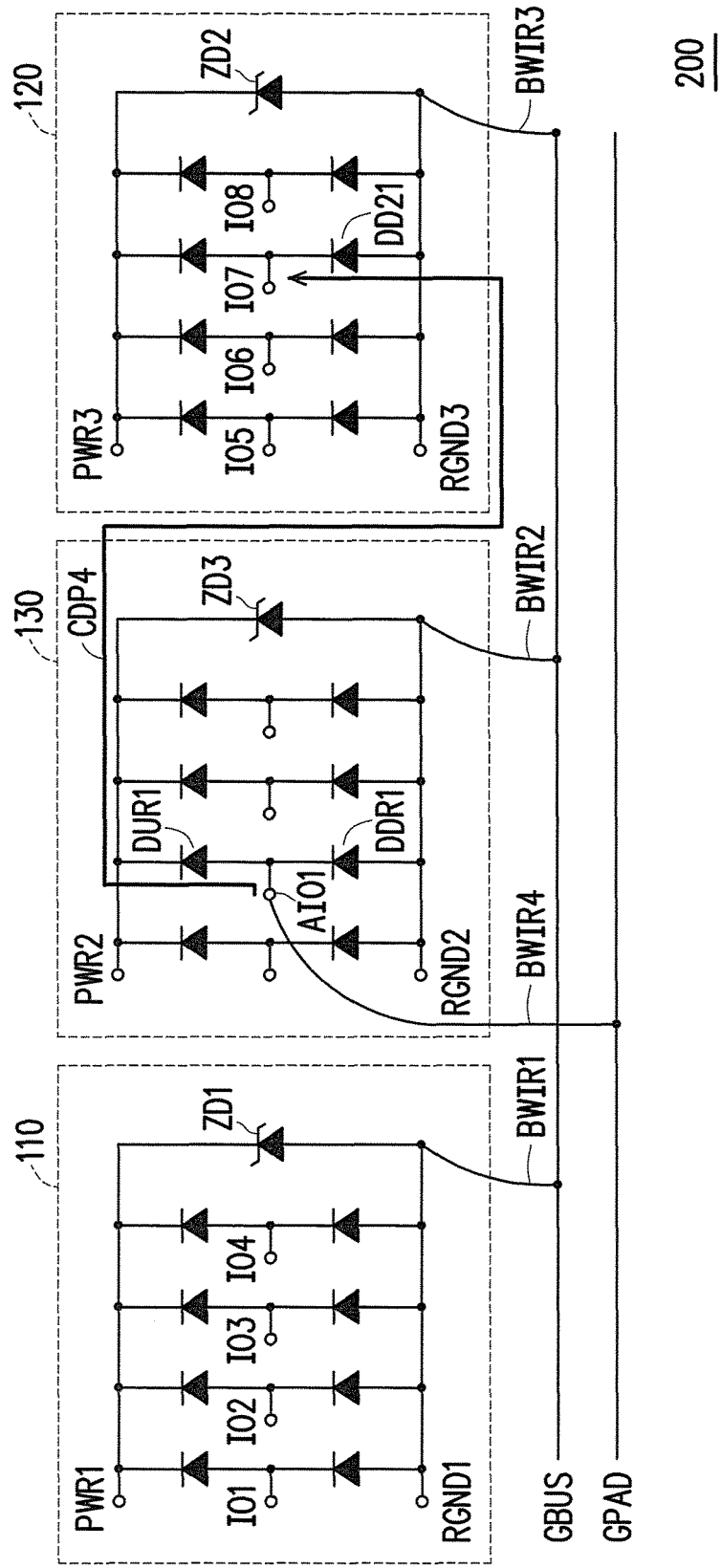

To further describe details of the operation in the embodiment of the invention, reference is made to FIGS. 2B and 2C illustrating an equivalent circuit and an electrostatic discharge operation of the transient voltage suppressing integrated circuit.

In FIG. 2B, the first transient voltage suppressing die 110 includes a plurality of diode strings and the Zener diode ZD1 and has the power terminal PWR1, the reference ground terminal RGND1, and the input output terminals IO1 to IO4. The diode strings are coupled in parallel with each other and coupled between the power terminal PWR1 and the reference ground terminal RGND1. The Zener diode ZD1 is also coupled between the power terminal PWR1 and the reference ground terminal RGND1. In addition, the anode of the Zener diode ZD1 is coupled to the reference ground terminal RGND1, and the cathode of the Zener diode ZD1 is coupled to the power terminal PWR1. Taking the diode string formed by channel diodes DU11 and DD11 as an example, a cathode of the channel diode DU11 is coupled to the power terminal PWR1, and an anode of the channel diode DU11 forms the input output terminal IO2 and is coupled to a cathode of the channel diode DD11. In addition, an anode of the channel diode DD11 is coupled to the reference ground terminal RGND1.

The first transient suppressing die 120 includes a plurality of diode strings and the Zener diode ZD2 and has a power terminal PWR3, the reference ground terminal RGND3, and the input output terminals IO5 to IO8. The first transient voltage suppressing die 120 and the first transient voltage suppressing die 110 may have the same circuit structures. Thus, details in this respect will not be repeated in the following.

In addition, the second transient voltage suppressing die 130 includes a plurality of diode strings and a Zener diode ZD3 coupled in parallel to the power terminal PWR2 and the reference ground terminal RGND2. In addition, in the diode string formed by channel diodes DUR1 and DDR1, a cathode of the channel diode DUR1 is coupled to the power terminal PWR2, and an anode of the channel diode DUR1 forms the input output terminal AIO1 and is coupled to a cathode of the channel diode DDR1. In addition, an anode of the channel diode DDR1 is coupled to the reference ground terminal RGND2.

The first transient voltage suppressing dies 110 and 120 and the second transient voltage suppressing die 130 respectively have the reference ground terminals RGND1 to RGND3, and are respectively electrically coupled to the common bus GBUS provided by the substrate through the bonding wires BWIR1, BWIR3, and BWIR2. In addition, the input output pin AIO1 of the second transient voltage suppressing die 130 is electrically coupled to the ground pin GPAD through the bonding wire BWIR4.

FIG. 2B is a schematic view illustrating a positive electrostatic discharge operation. When an electrostatic discharge voltage greater than the ground voltage (e.g., 0V) is presented on an input output pin (not shown) coupled to the input output terminal IO2, since the first transient voltage suppressing die 110 is connected to the second transient voltage suppressing die 130 through the common bus GBUS, a current path CDP3 from the input output terminal IO2, the reference ground RGND1, the common bus GBUS, the reference ground terminal RGND2 to the input out terminal AIO1 is formed and extends to the ground pin GPAD, so that the electrostatic discharge current may flow to the ground voltage.

FIG. 2C is a schematic view illustrating a negative electrostatic discharge operation. When an electrostatic discharge voltage lower than the ground voltage (e.g., 0V) is presented on an input output pin (not shown) coupled to the input output terminal IO7, for example, a current path CDP4 passing through the second transient voltage suppressing die 130, the common bus GBUS, and the first transient voltage suppressing die 120 is formed, so as to discharge the electrostatic discharge current, thereby allowing multiple dies to undertake the energy of electrostatic discharge.

In this embodiment, the first transient voltage suppressing dies 110 and 120 and the second transient voltage suppressing die 130 may be implemented by using dies with the same circuit structure. Concerning the embodiment of the second transient voltage suppressing die 130, only one of the one or more input output terminals of the second transient voltage suppressing die 130 needs to be selected as the input output terminal, and the selected input output terminal is electrically coupled to the common bus GBUS provided by the substrate through the bonding wire.

Figure 3A:
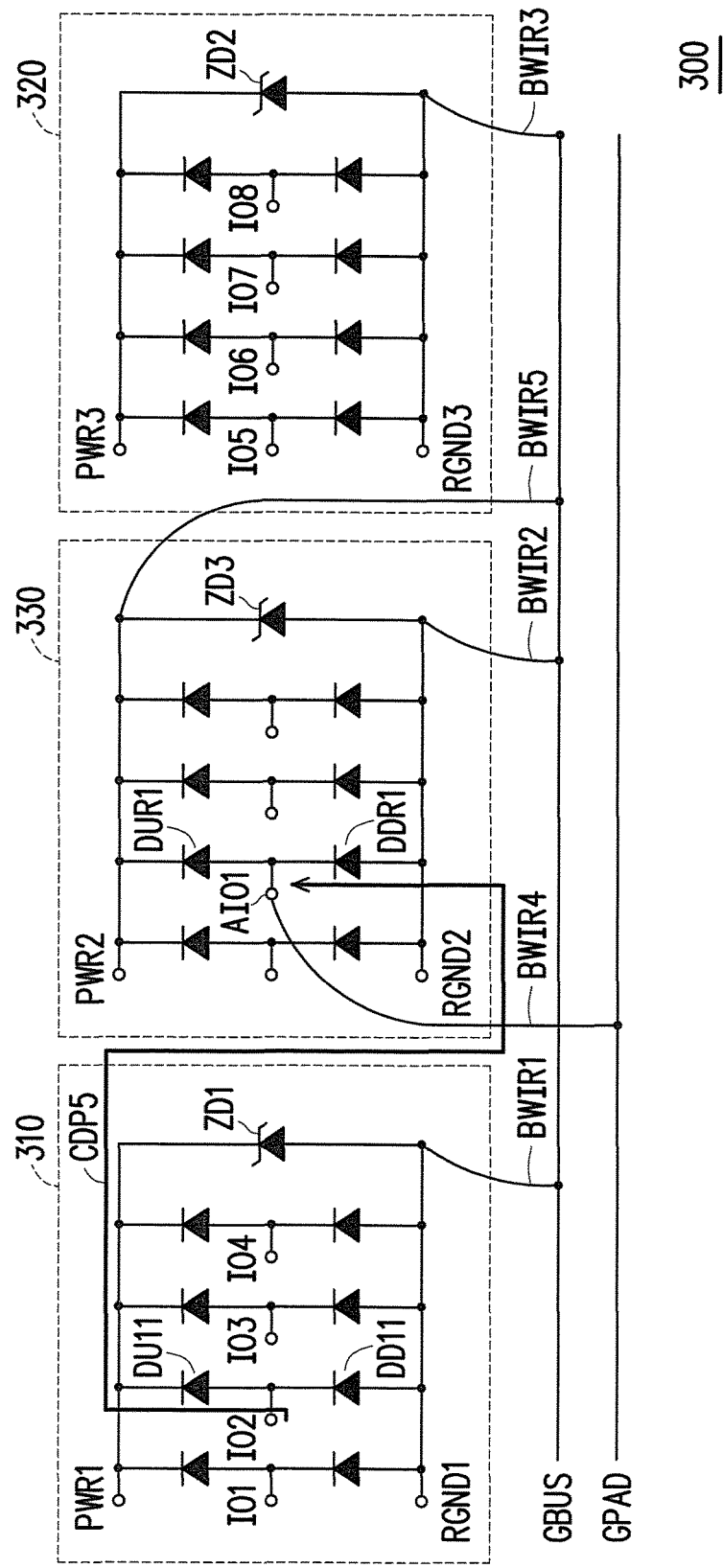
FIGS. 3A and 3B are schematic views illustrating an equivalent circuit and an electrostatic discharge operation of a multi-channel transient voltage suppressing integrated circuit according to another embodiment of the invention.
Figure 3B:
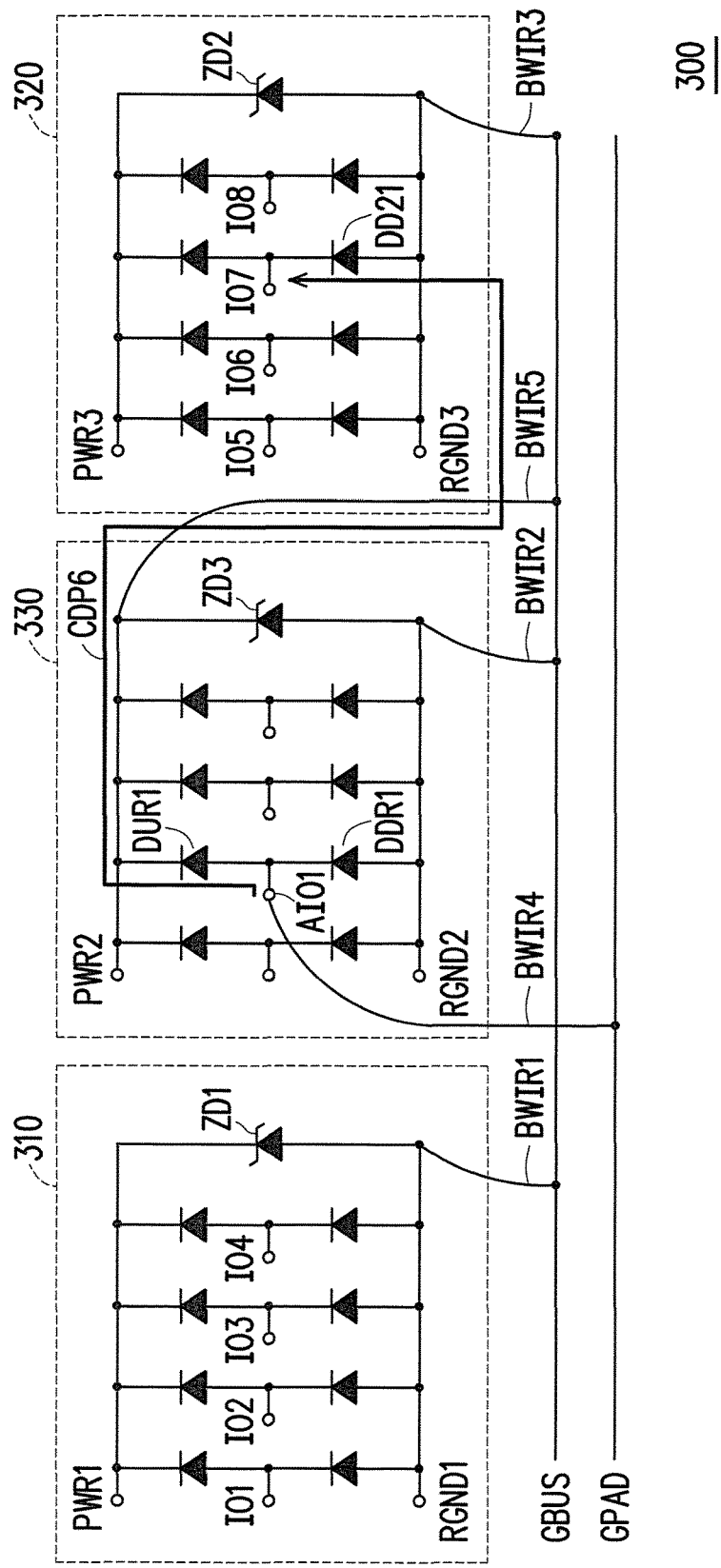

FIGS. 3A and 3B are schematic views illustrating an equivalent circuit and an electrostatic discharge operation of a multi-channel transient voltage suppressing integrated circuit according to another embodiment of the invention. What differs from the previous embodiment is that the power terminal PWR2 of a second transient voltage suppressing die 330 is electrically coupled to the common bus GBUS provided by the substrate through a bonding wire BWIR5. In addition to the characteristics of the previous embodiment, such structure may further reduce a conductive voltage of a current path when a negative electrostatic discharge current is discharged, so as to further facilitate the protection against electrostatic discharge.

FIG. 3A is a schematic view illustrating a positive electrostatic discharge operation. When an electrostatic discharge voltage greater than the ground voltage (e.g., 0V) is presented on an input output pin (not shown) coupled to the input out terminal IO2, a current path CDP5 is the same as the embodiment of FIG. 2B. Thus, details in this respect will not be repeated in the following.

FIG. 3C is a schematic view illustrating a negative electrostatic discharge operation. When an electrostatic discharge voltage lower than the ground voltage (e.g., 0V) is presented on an input output pin (not shown) coupled to the the input output terminal IO7, a current path CD6 passing through two dies is generated, so as to allow multiple dies to undertake the energy of electrostatic discharge. Since the power terminal PWR2 of the second transient voltage suppressing die 330 is electrically coupled to the common bus GBUS, the current path CDP6 only passes through the channel diodes DUR1 and DD21 and avoid the Zener diode ZD3. Thus, a conductive voltage on the current path CDP6 is lowered, and the protection against electrostatic discharge is facilitated.

Figure 4:
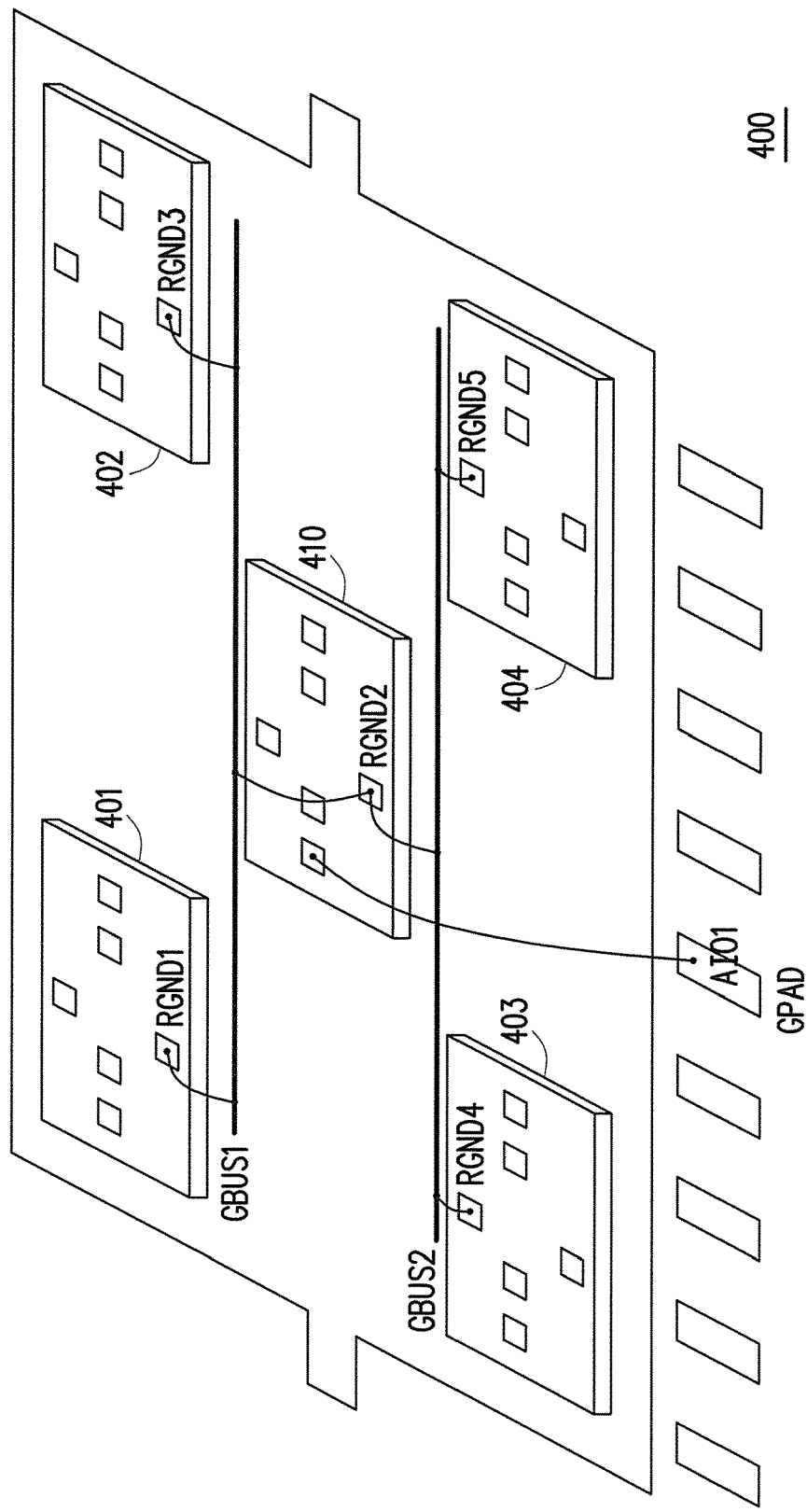
FIGS. 4 and 5 are schematic views illustrating die arrangements of a multi-channel transient voltage suppressing integrated circuit according to different embodiments of the invention.
Figure 5:
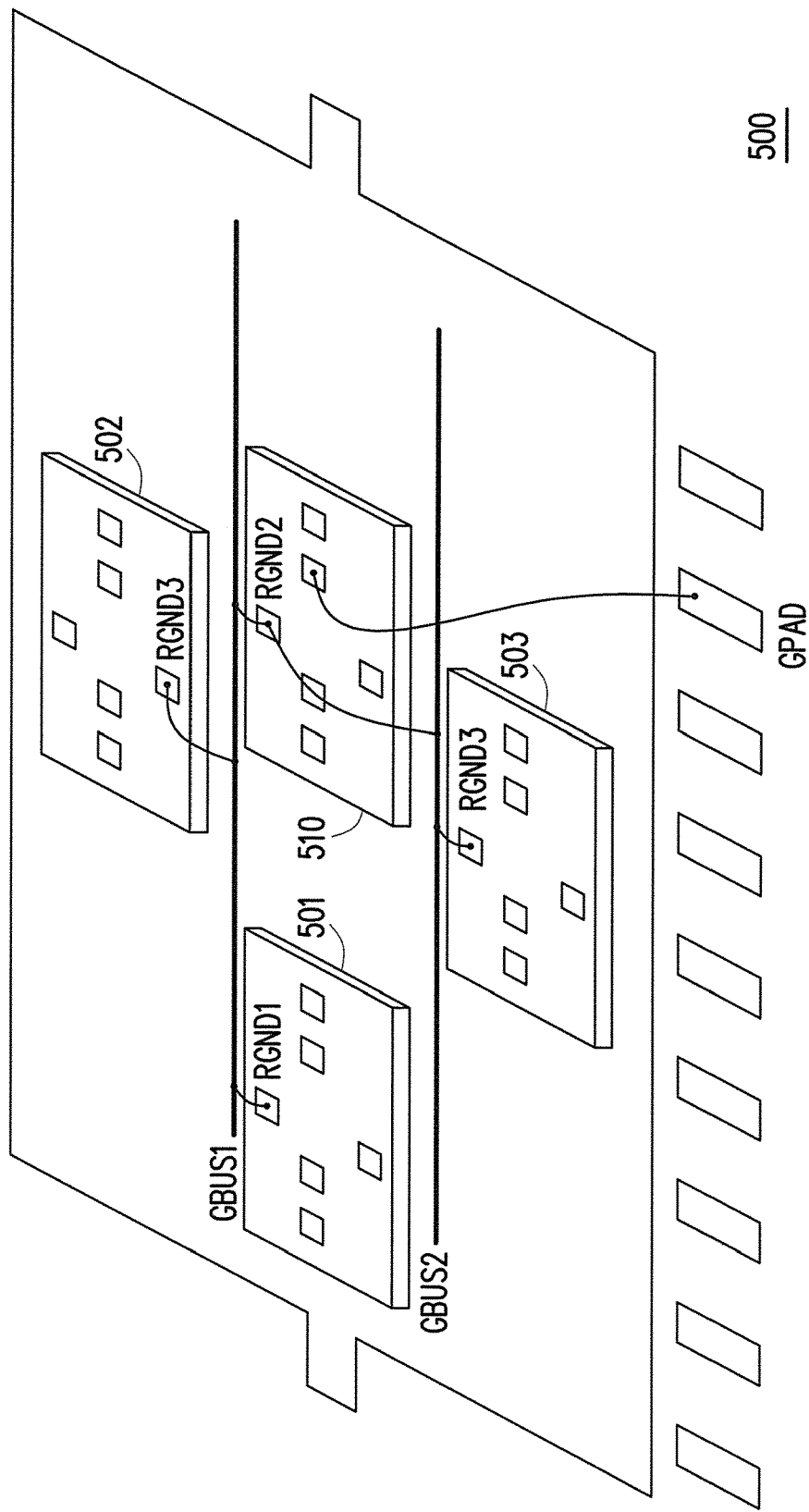

Referring to FIGS. 4 and 5, FIGS. 4 and 5 are schematic views illustrating die arrangements of a transient voltage suppressing integrated circuit according to different embodiments of the invention. In the embodiments of the invention, the first transient voltage suppressing die and the second transient voltage suppressing die may be arranged based on the embodiment of FIG. 2, so that the second transient voltage suppressing die 130 may be disposed between the first transient voltage suppressing dies 110 and 120. With such arrangement, the current paths generated by the electrostatic discharge voltages at the input output terminals may have a uniform length. Consequently, the protection against electrostatic discharge may not be reduced because of an overly long current path generated by one or a portion of the input output terminals. In addition to the arrangement of FIG. 2, the dies on the transient voltage suppressing integrated circuit according to the embodiments of the invention also permits a variety of different arrangements.

Referring to FIG. 4, a transient voltage suppressing integrated circuit 400 of FIG. 4 has first transient voltage suppressing dies 401 to 404 and a second transient voltage suppressing die 410. The first transient voltage suppressing dies 401 to 404 respectively have the reference ground terminals RGND1, RGND3, RGND4, and RGND5, and the second transient voltage suppressing die 410 has the reference ground terminal RGND2. The reference ground terminals RGND1 and RGND3 may be respectively electrically coupled to a common bus GBUS1 provided by the substrate via different bonding wires, the reference ground terminals RGND4 and RGND5 are respectively electrically coupled to a common bus GBUS2 provided by the substrate via different bonding wires, and the reference ground terminal RGND2 is electrically coupled to the common buses GBUS1 and RBUS2 through a plurality of bonding wires. The common buses GBUS1 and GBUS2 are electrically connected. In FIG. 4, the second transient voltage suppressing die 410 may be disposed at a position near a geometric center of the first transient voltage suppressing dies 401 to 404 or directly disposed at the geometric center of the first transient voltage suppressing dies 401 to 404. Thus, lengths of current paths generated by electrostatic discharge voltages generated at input output terminals of the first transient voltage suppressing dies 401 to 404 thus become more uniform.

Referring to FIG. 5, a transient voltage suppressing integrated circuit 500 of FIG. 5 has first transient voltage suppressing dies 501 to 503 and a second transient voltage suppressing die 510. The first transient voltage suppressing dies 501 to 503 are disposed as a triangle, and the second transient voltage suppressing die 510 is disposed at a position near a geometric center of the first transient voltage suppressing dies 501 to 503, such that lengths of current paths generated at a plurality of input output terminals of the first transient voltage suppressing dies 501 to 503 may become more uniform.

It should be noted that there is no specific limitation on the numbers of the first and second transient voltage suppressing dies. The designer may set different numbers of the first and second transient voltage suppressing dies based on the practical requirements, and set different arrangements of the first and second transient voltage suppressing dies based on the shape of the substrate and a position of an outer lead provided by the substrate.

In view of the foregoing, one or more second transient voltage suppressing dies are provided in the transient voltage suppressing integrated circuit according to the embodiments of the invention, so as to share with the first transient voltage suppressing die the energy generated by electrostatic discharge and effectively facilitate the protection offered by the transient voltage suppressing integrated circuit against electrostatic discharge.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transient voltage suppressing integrated circuit, comprising:
    at least one input output pin;
    a ground pin;
    a substrate, providing a common bus;
    at least one first transient voltage suppressing die, disposed on the substrate and comprising a first input output terminal and a first reference ground terminal; and
    a second transient voltage suppressing die, disposed on the substrate and comprising a second input output terminal and a second reference ground terminal,
    wherein the second reference ground terminal is electrically coupled to the first reference ground terminal through the common bus, the first input output terminal is coupled to one of the at least one input output pin, and the second input output terminal is coupled to the ground pin, and
    when an electrostatic discharge voltage is presented on one of the at least one input output pin, a current path passing through the first input output terminal coupled to the input output pin, the first reference ground terminal, the common bus, the second reference ground terminal, and the second input output terminal to the ground pin is formed.

2. The transient voltage suppressing integrated circuit as claimed in claim 1, wherein the first transient voltage suppressing die comprises:
    a diode string, coupled between a power terminal and the first reference ground terminal and comprising the first input output terminal; and
    a Zener diode, wherein an anode of the Zener diode is coupled to the first reference ground terminal, and a cathode of the Zener diode is coupled to the power terminal.

3. The transient voltage suppressing integrated circuit as claimed in claim 2, wherein the diode string comprises:
    a first channel diode, wherein a cathode of the first channel diode is coupled to the power terminal, and an anode of the first channel diode is coupled to the first input output terminal; and
    a second channel diode, wherein a cathode of the second channel diode is coupled to the anode of the first channel diode, and an anode of the second channel diode is coupled to the first reference ground terminal.

4. The transient voltage suppressing integrated circuit as claimed in claim 1, wherein the second transient voltage suppressing die comprises:
    a diode string, coupled between a power terminal and the second reference ground terminal and comprising the second input output terminal; and
    a Zener diode, wherein an anode of the Zener diode is coupled to the second reference ground terminal, and a cathode of the Zener diode is coupled to the power terminal.

5. The transient voltage suppressing integrated circuit as claimed in claim 4, wherein the diode string comprises:
    a first channel diode, wherein a cathode of the first channel diode is coupled to the power terminal, and an anode of the first channel diode is coupled to the second input output terminal; and
    a second channel diode, wherein a cathode of the second channel diode is coupled to the anode of the first channel diode, and the cathode of the second channel diode is coupled to the second reference ground terminal.

6. The transient voltage suppressing integrated circuit as claimed in claim 1, wherein the second transient voltage suppressing die and the first transient voltage suppressing die have the same structures.

7. The transient voltage suppressing integrated circuit as claimed in claim 1, wherein bases of the transient voltage suppressing dies are electrically isolated from the substrate.

8. The transient voltage suppressing integrated circuit as claimed in claim 1, wherein the second transient voltage suppressing die further has a power terminal, and the power terminal is electrically coupled to the common bus.

9. The transient voltage suppressing integrated circuit as claimed in claim 1, wherein when the number of the first transient voltage suppressing die is plural, the second transient voltage suppressing die is disposed at a geometric center of the transient voltage suppressing dies.

10. The transient voltage suppressing integrated circuit as claimed in claim 1, wherein the electrostatic discharge voltage presented on the first input output terminal is a negative electrostatic discharge voltage, and the electrostatic discharge voltage presented on the second input output terminal is a positive electrostatic discharge voltage.

* * * * *